(12) United States Patent
Tonder et al.

(10) Patent No.: US 10,571,491 B2
(45) Date of Patent: Feb. 25, 2020

(54) MEASURING DEVICE AND A METHOD FOR IMPROVED IMAGING OF THE SPECTRAL CHARACTERISTICS

(71) Applicant: Rohde & Schwarz GmbH & Co. KG, Munich (DE)

(72) Inventors: Nico Tonder, Haar (DE); David Schmidt, Munich (DE); Kurt Schmidt, Grafing (DE); Johann Huber, Markt Schwaben (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 848 days.

(21) Appl. No.: 14/402,661

(22) PCT Filed: May 21, 2013

(86) PCT No.: PCT/EP2013/060398
§ 371 (c)(1),
(2) Date: Nov. 20, 2014

(87) PCT Pub. No.: WO2013/174806
PCT Pub. Date: Nov. 28, 2013

(65) Prior Publication Data
US 2015/0112642 A1    Apr. 23, 2015

(30) Foreign Application Priority Data

May 21, 2012    (DE) .................. 10 2012 208 405

(51) Int. Cl.
*G01R 13/02*    (2006.01)
*G01B 9/02*    (2006.01)
(Continued)

(52) U.S. Cl.
CPC ......... *G01R 13/02* (2013.01); *G01B 9/02044* (2013.01); *G01R 13/029* (2013.01);
(Continued)

(58) Field of Classification Search
USPC ......... 702/21, 39, 56, 63, 79, 180, 182, 189; 345/174; 704/500
See application file for complete search history.

(56) References Cited

U.S. PATENT DOCUMENTS 4,694,244 A * 9/1987 Whiteside ............ G01R 13/345
324/121 R
4,843,631 A * 6/1989 Steinpichler ............. G06K 9/52
382/191
(Continued)

FOREIGN PATENT DOCUMENTS

DE       233872 A1   3/1986
DE   102006047994 A1   4/2008
(Continued)

OTHER PUBLICATIONS

"Fundamentals of Real-Time Spectrum Analysis", Internet Citation, Jan. 1, 2008, Tektronix, <<http://www.tektronix-resources.com/0803 pulsedrf/funda mentals_spectruma nalysis.pdf>>, 42 pages.

*Primary Examiner* — Michael J Dalbo
(74) *Attorney, Agent, or Firm* — Lee & Hayes, P.C.

(57) ABSTRACT

A measuring device includes a signal-processing unit for the registration of a first signal in the time domain and a histogram-generating unit for the indirect generation of a histogram in the frequency domain from the first signal. The histogram-generating unit provides a frequency grid-point variation unit.

12 Claims, 7 Drawing Sheets

(51) Int. Cl.
  *G01R 13/34*   (2006.01)
  *G01R 23/18*   (2006.01)
(52) U.S. Cl.
  CPC ............ *G01B 9/02* (2013.01); *G01R 13/0254* (2013.01); *G01R 13/345* (2013.01); *G01R 23/18* (2013.01)

(56) References Cited

U.S. PATENT DOCUMENTS

| | | | | |
|---|---|---|---|---|
| 6,104,374 | A * | 8/2000 | Sullivan | G01R 13/345 345/694 |
| 2004/0024548 | A1 | 2/2004 | Genther et al. | |
| 2008/0170046 | A1* | 7/2008 | Rimon | G06F 3/044 345/174 |
| 2010/0052653 | A1* | 3/2010 | LeBrun | G01R 13/0218 324/76.47 |
| 2010/0235124 | A1* | 9/2010 | Tracy | G01R 13/0263 702/76 |
| 2011/0282610 | A1* | 11/2011 | Engholm | G01R 13/0254 702/67 |
| 2012/0020397 | A1* | 1/2012 | Estrada | G01R 19/2516 375/224 |
| 2012/0215546 | A1* | 8/2012 | Biswas | G10H 1/40 704/500 |

FOREIGN PATENT DOCUMENTS

| | | | |
|---|---|---|---|
| EP | 0937987 | A2 | 8/1999 |
| EP | 0969285 | A2 | 1/2000 |
| EP | 2386869 | A2 | 11/2011 |

\* cited by examiner

MEASURING DEVICE AND A METHOD FOR IMPROVED IMAGING OF THE SPECTRAL CHARACTERISTICS

TECHNICAL FIELD

Background

This application claims priority to and is a national phase application of International Application No. PCT/EP2013/060398 filed on May 21, 2013, entitled "A measuring device and a method for improved imaging of the spectral characteristics," which claims priority to and the benefit of German Patent Application No. DE 10 2012 208 405.3 filed on May 21, 2012, entitled "A measuring device and a method for improved imaging of the spectral characteristics," both of which are hereby incorporated by reference in their entirety.

The invention relates to a measuring device and a method for the operation of a measuring device which allow an improved imaging of spectral characteristics.

In a conventional spectrum analyzer, a digitized signal in the time domain is converted by means of a transformation into a time sequence of spectra. The time sequence of the spectra is then conditioned for display on a screen in such a manner that the human user obtains the desired measurement results. Since the time interval between two successive spectra is typically smaller by orders of magnitude than the minimal interval which the display device can process, or respectively the human observer can perceive, the data conditioning is associated with a heavy reduction of information. Conventionally, in this context, a histogram is prepared. With a histogram, a hit pattern is imaged for every spectrum in a two-dimensional raster of frequency values and amplitude values. The frequency of occurrence of hits on the raster points is counted over several successive spectra. The number of hits per raster point determined in this manner can be displayed on the screen through intensity gradations or color gradations of a corresponding pixel in order to provide the user with a qualitative impression of the distribution of frequencies of occurrences of the frequency-amplitude value pairs over a given observation time.

In particular, however, the imaging of the spectrum on the two-dimensional raster of frequency and amplitude values for the histogram display conceals challenges, because the method selected here has a direct influence on the qualitative impression of the image. Accordingly, the points-method is conventionally used. Frequency grid-points of the sampled spectrum correspond to the x-values in the two-dimensional raster. The imaging of the amplitude on the y-values in the raster is implemented through a quantization. Accordingly, precisely one hit per x-value is counted for every spectrum. If more frequency grid-points of the sampled spectrum are present than x-values in the raster, it is also possible to image several adjacent frequency grid-points on the one x-value in the raster. However, the disadvantage here is that constant peaks in the spectrum lead to unconnected point clusters in the resulting histogram display. Accordingly, the display can be read only with difficulty.

The German published application DE 10 2006 047 994 A1 shows a so-called line method. By contrast with the points-method, several coherent y-values in every column are counted as hits. These y-portions are determined in such a manner that the curve course of the spectrum is imaged as well as possible. The disadvantage here, however, is an unnatural impression of the image, above all, in the background noise. Beyond this, a systematic amplitude error is obtained in the background noise. Furthermore, a triggering on frequencies of occurrence is not possible.

SUMMARY

The invention is based on the object of providing a measuring device and a method for the operation of a measuring device which allow a simple and accurate presentation of spectra in a histogram display.

The object is achieved according to the invention for the device and for the method by discussed herein. Advantageous further developments form the subject matter of the dependent claims relating back to these claims.

A measuring device according to the invention comprises a signal-processing unit for the registration of a first signal in the time domain and a histogram-generating unit for the indirect generation of a histogram in the frequency domain from the first signal. The histogram-generating unit provides a frequency grid-point variation unit. Accordingly, in the case of constant signals in the frequency domain, significantly more accurate and visually organized displays of the histogram can be generated.

In this context, the frequency grid-point variation unit is embodied to generate a displacement of frequency positions from frequency grid-points of a second signal derived from the first signal in the frequency domain. The histogram-generating unit is embodied to determine the histogram on the basis of the second signal. Accordingly, with low technical effort, significantly more accurate and visually organized displays of the histogram can be generated.

By preference, the histogram-generating unit provides a transformation unit. The transformation unit is embodied to implement a transformation of the first signal or of a third signal derived from the first signal from the time domain into the frequency domain. The histogram-generating unit preferably provides a processing unit. This processing unit is embodied to form the histogram from the second signal. Accordingly, a simple construction of the measuring device is possible.

The transformation unit is preferably embodied to generate the third signal in the frequency domain from the first signal in the time domain. In this case, the frequency grid-point variation unit is an interpolation unit which is embodied to generate the second signal through interpolation of the third signal. In this manner, the measuring device can be constructed in a particularly simple manner.

The frequency grid-point variation unit is preferably a multiplier which is embodied to multiply the first signal by a variable factor to form the third signal. The transformation unit is then embodied to generate the second signal in the frequency domain from the third signal in the time domain. Accordingly, only a low processing performance is required from the processing unit.

The sampling-point variation unit is preferably embodied in such a manner that the displacement of the frequency positions of the frequency grid-points is implemented by a maximum of one half interval of the frequency grid-points. This avoids display errors caused by an excessively wide displacement.

The frequency grid-point variation unit is preferably embodied in such a manner that, in each case, the displacement of the frequency positions of the frequency grid-points adopts a random value. In this manner, an optimal distribution of the grid-points and accordingly an optimum display of the histogram are guaranteed.

A method according to the invention serves for the operation of a measuring device. A first signal is registered in the time domain. A histogram in the frequency domain is generated indirectly from the first signal. A displacement of frequency positions of frequency grid-points of a second signal in the frequency domain derived from the first signal is generated in this context. The histogram is determined on the basis of the second signal. Accordingly, in the case of constant signals in the frequency domain, significantly more accurate and more visually organized displays of the histogram can be generated.

BRIEF DESCRIPTION OF THE DRAWINGS

In the following, the invention is described by way of example with reference to the drawings in which advantageous exemplary embodiments of the invention are illustrated. The drawings show.

Initially, the problems underlying the present invention will be explained with reference to FIG. 1a-FIG. 2. Following this, the construction of different exemplary embodiments of the measuring device will be shown with reference to FIGS. 3-4b. The precise functioning and the advantages of the exemplary embodiments of the measuring device and of the method will then be presented with reference to FIGS. 5a-7. Finally, with reference to FIGS. 8 and 9, more detailed information regarding the function of two exemplary embodiments of the method will be given. The presentation and description of identical elements in similar drawings have not been repeated in some cases.

DETAILED DESCRIPTION

Figure 1A:
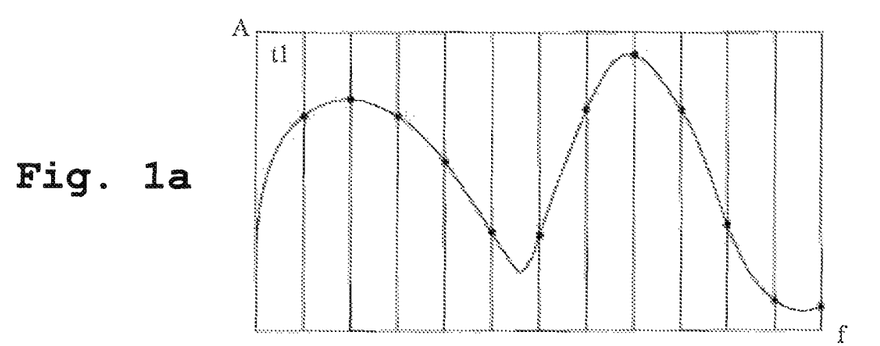
FIG. 1a illustrates a first signal characteristic in the case of an exemplary spectrum analyzer.
Figure 1B:
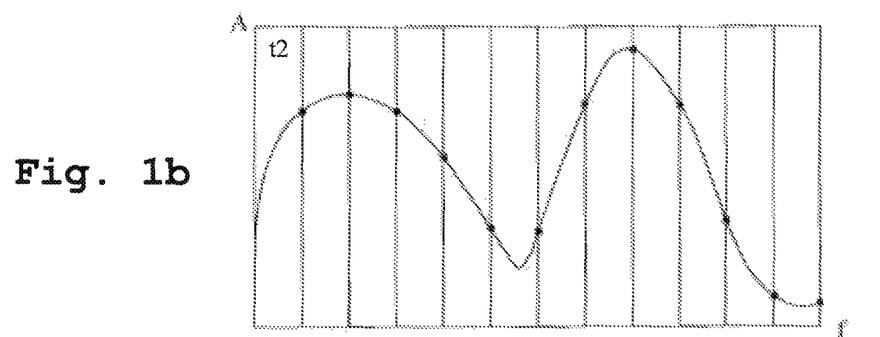
FIG. 1b illustrates a second signal characteristic in the case of an exemplary spectrum analyzer.
Figure 1C:
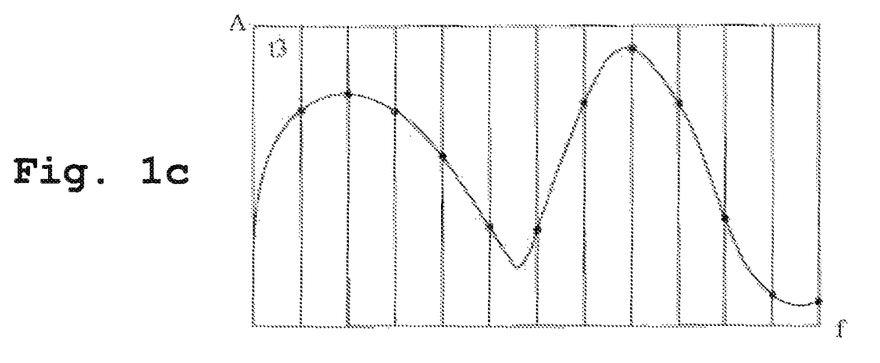
FIG. 1c illustrates a third signal characteristic in the case of an exemplary spectrum analyzer.

FIGS. 1a-FIG. 1c show signal characteristics in the frequency domain. These signal characteristics correspond to the times t1, t2, t3. The signal presented here is a signal with time-constant spectrum. Accordingly, the displays in FIG. 1a, FIG. 1b and FIG. 1c are identical. The points in the curves correspond to the frequency grid-points. Only the measured values at precisely these grid-points are therefore used for the formation of the subsequent histogram. These grid-points are at the same position for every period of the signal.

Figure 2:
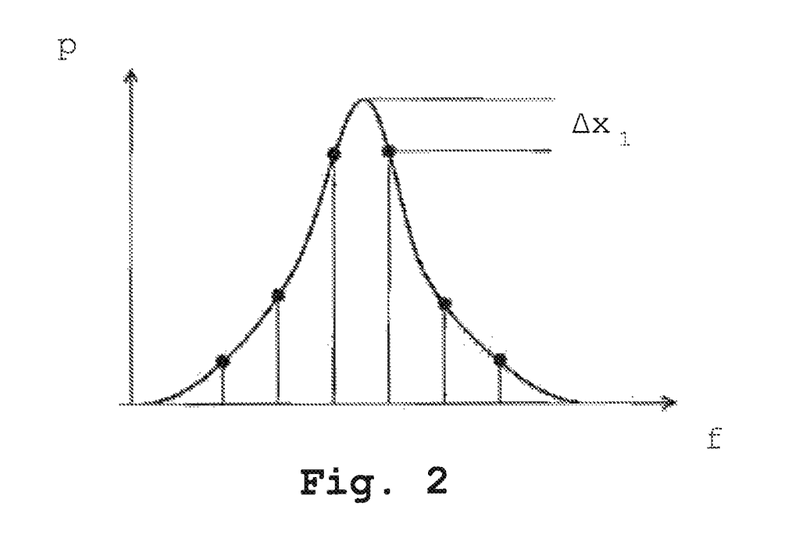
FIG. 2 illustrates a superposition of the display of an exemplary spectrum analyzer and of the real signal characteristic.

FIG. 2 shows a histogram display of an exemplary measuring device. The frequency is displayed on the x-axis, while the frequency of occurrence of the individual frequencies is plotted on the y-axis. The points on the curve correspond to the values processed in the histogram. For the sake of visual clarity, the real underlying frequency curve of the signal has been additionally shown. This real frequency characteristic corresponds to the continuous curve in FIG. 2. However, this continuous curve is not shown in the histogram display. It is clearly evident here that no value imaged in the histogram is disposed within the region of the maximum of the real frequency characteristic. Accordingly, a display error at the level of $\Delta x_1$ is obtained.

The display error $\Delta x_1$ shown in FIG. 2 occurs because the frequency grid-points used always come to be disposed at the same position of the spectrum with every run through the spectrum. Accordingly, a significant interval occurs between the frequency grid-points used.

Figure 3:
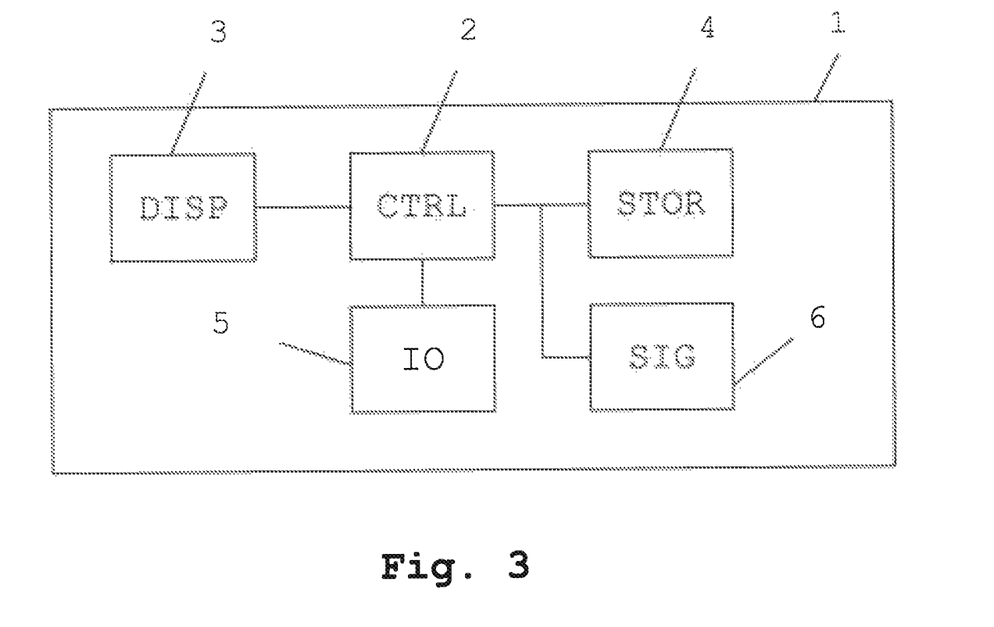
FIG. 3 illustrates a first exemplary embodiment of the measuring device according to the invention in a block-circuit diagram.

FIG. 3 shows a first exemplary embodiment of the measuring device according to the invention. This measuring device is a spectrum analyser. However, the invention is also suitable for all other measuring devices which use a histogram displays of signals. The measuring device 1 comprises a control unit 2, a display unit 3, a storage unit 4, a communications unit 5 and a signal-processing unit 6. The control unit 2 thus controls all other components. The display unit 3 here is embodied to be controlled by the control unit 2 in order to execute a user dialogue and to display measurement results. In this context, the storage unit 4 is embodied to be supplied with the data from the control unit 2 and to deliver data to the control unit 2. The storage unit 4 accordingly stores the data.

In this context, the communications unit 5 is embodied to be used by the control unit 2 to communicate with other devices via external interfaces. The signal processing unit 6 is embodied here to generate and transmit signals necessary for the function of the measuring device 1 and/or to receive, to process further and to transmit to the control unit 2 signals necessary the function of the measuring device 1.

If a signal in the time domain is to be transformed into a histogram display, the signal of the signal-processing unit 6 is supplied via a connection not illustrated here. The signal-processing unit 6 converts the signal, reduces, for example, the frequency and digitises the signal. The resulting digitised signal is transmitted to the control unit 2 which implements the further processing. In this context, a variation of the frequency grid-points and a transformation into the frequency domain is implemented. The precise function will be explained in greater detail with reference to FIG. 4a, FIG. 4b, FIG. 8 and FIG. 9. The resulting histogram is displayed on the display unit 3.

Figure 4A:
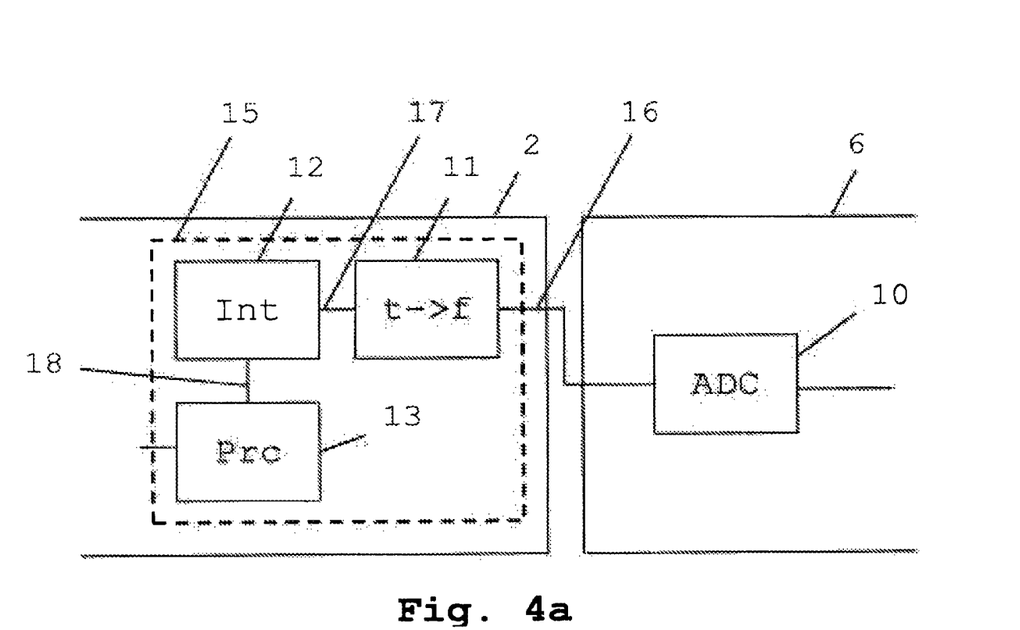
FIG. 4a illustrates a second exemplary embodiment of the measuring device according to the invention in a detail view.

FIG. 4a shows a second exemplary embodiment of the measuring device according to the invention in a detail view. The view presented here corresponds to a detail from the view shown in FIG. 3. Here, only a part of the signal-processing unit 6 and a part of the control unit 2 are shown. This signal-processing unit 6 contains an analog-digital converter 10. The analog-digital converter 10 is accordingly connected to further components of the signal-processing unit 6, which are not illustrated here. In this context, the control unit 2 contains a histogram-generating unit 15. The histogram-generating unit 15 accordingly contains a transformation unit 11 which is connected to the analog-digital converter 10. Beyond this, the transformation unit 11 is connected to an interpolator 12. The interpolator 12 is connected to a processing unit 13. This processing unit 13 is connected in turn to further components of the control unit 2.

A signal to be investigated by the measuring device is initially optionally reduced in its frequency and pre-processed. Following this, it is supplied to the analog-digital converter 10. This digitizes the signal and supplies it as a first signal 16 to the transformation unit 11. The transformation unit 11 transforms the first signal 16 into the frequency domain and accordingly generates a third signal 17. For example, a Fourier transform, especially a Fast-Fourier transform can be used for this purpose. The third signal 17 in the frequency domain is then supplied to the interpolator 12. As a result of the transformation into the frequency domain, frequency grid-points are obtained. The interpolator 12 now interpolates additional grid-points between the grid-points of the third signal 17 resulting from the transformation. The interpolator 12 is therefore a frequency grid-point variation unit. For every spectrum processed in this context, different frequency grid-points are interpolated. Accordingly, a very narrow raster of frequency grid-points is provided in a third signal 17. The resulting values are supplied to the processing unit 13 which adds them up, sorted according to frequency. That is, the processing unit 13 further processes the interpolated frequency grid-points within the second signal 18 to form a histogram. The histogram generated in this manner is then optionally further processed and displayed by the display unit 3 from FIG. 3.

Figure 4B:
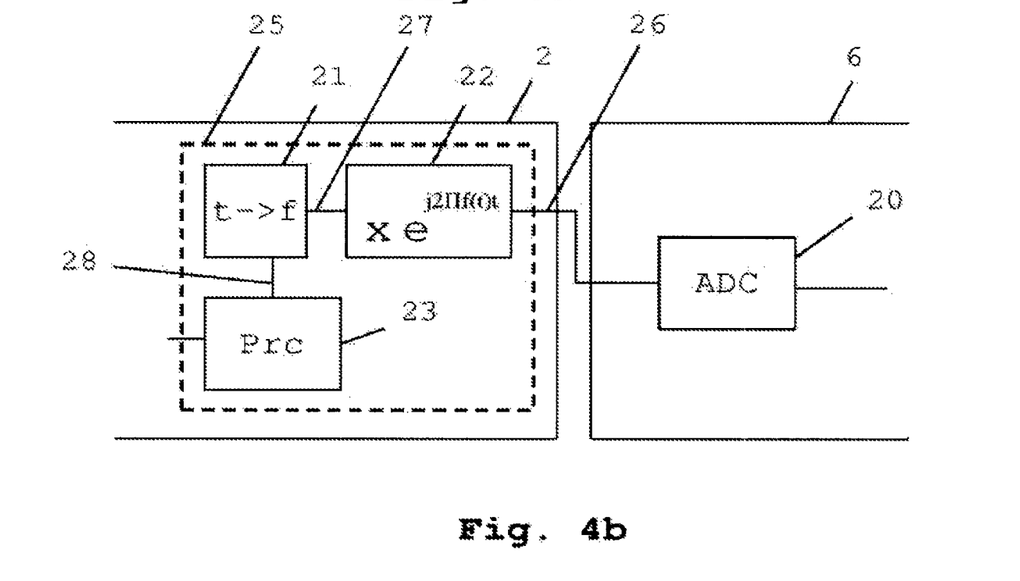
FIG. 4b illustrates a third exemplary embodiment of the measuring device according to the invention in a detail view.

FIG. 4b shows a third exemplary embodiment of the measuring device according to the invention in a detail view. The view in FIG. 4b corresponds largely to the view from FIG. 4a. However, instead of an interpolator 12, a multiplier 22 is used here as the grid-point variation unit for the variation of the frequency grid-points. This begins with the digitised signal for the time domain which corresponds here to the first signal 26. That is, the output signal of the analog-digital converter 20, which corresponds to the analog-digital converter 10 from FIG. 4a, is supplied to the multiplier 22, which multiplies the first signal 26 by a low-frequency, complex exponential oscillation to form a third signal 27. For example, a multiplication by the factor $e^{j2\pi f(t)t}$ is implemented. This leads to a displacement of the frequency grid-points after transformation into the frequency domain by the transformation unit 21, which is connected downstream of the multiplier 22. The resulting second signal 28 is again further processed by the processing unit 23, which corresponds to the processing unit 13. The signals which are processed by the processing units 13 and 23 correspond to one another.

Figure 5A:
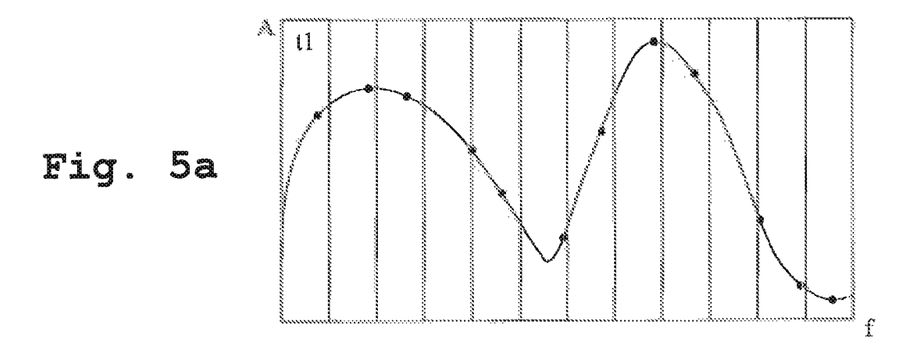
FIG. 5a illustrates a first signal characteristic in an exemplary embodiment of the measuring device according to the invention.
Figure 5B:
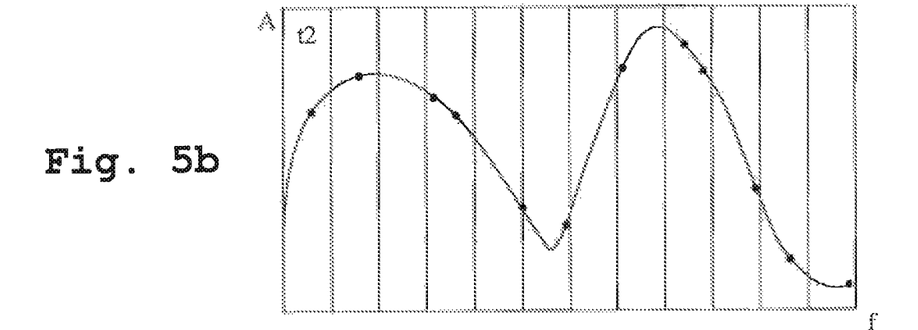
FIG. 5b illustrates a second signal characteristic in an exemplary embodiment of the measuring device according to the invention.
Figure 5C:
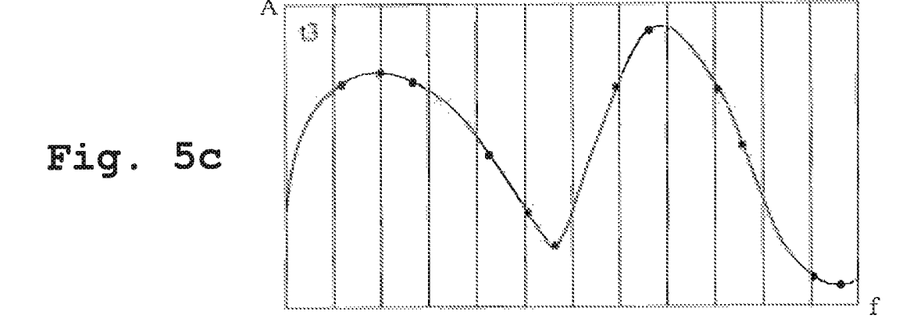
FIG. 5c illustrates a third signal characteristic in an exemplary embodiment of the measuring device according to the invention.

In FIGS. 5a-5c, several signal characteristics of individual spectra are now displayed. The continuous curves correspond to the real signal characteristic. The points correspond to the displaced frequency grid-points. Accordingly, it is shown that frequency grid-points are distributed over the entire real signal characteristic.

Figure 6:
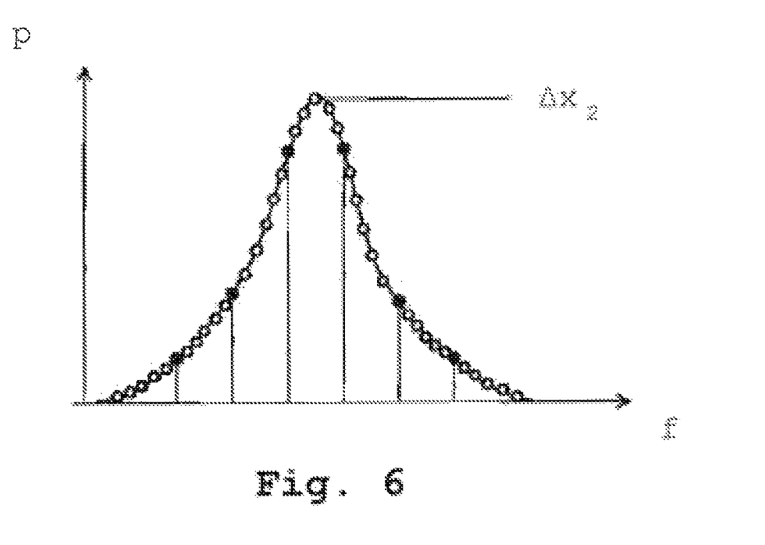
FIG. 6 illustrates a superposition of a display through an exemplary embodiment of the measuring device according to the invention and of the real signal characteristic.

FIG. 6 shows the histogram display of a measuring device according to the invention and of the superposed ideal histogram. The continuous curve corresponds to the ideal characteristic of the histogram. The points drawn on the curve correspond to the frequency grid-points which result from the variation. By comparison with FIG. 2, it is clearly evident that the frequency grid-points are now disposed significantly closer together. The real characteristic of the histogram curve is accordingly reproduced significantly more accurately by the frequency grid-points. Only a very small measurement error $\Delta x_2$ is obtained.

Figure 7:
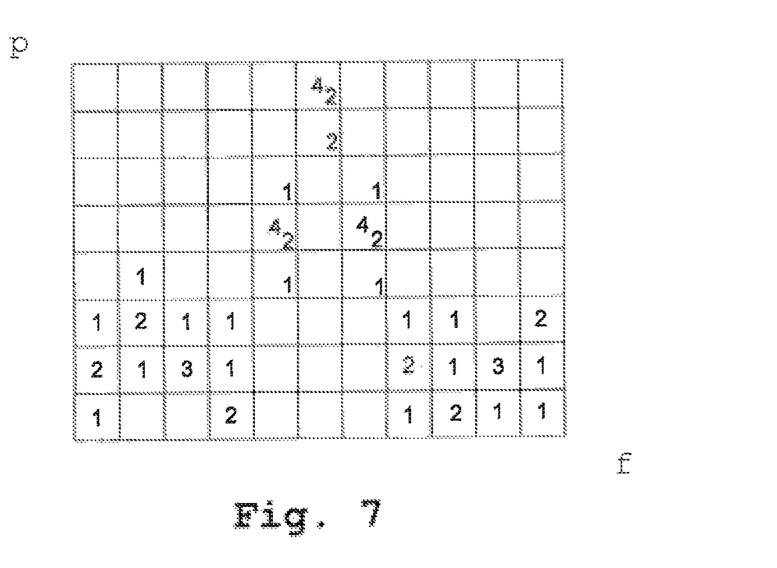
FIG. 7 illustrates histogram displays of an exemplary measuring device and of an exemplary embodiment of a measuring device according to the invention in a detail view at pixel level.

FIG. 7 further shows a detail view of a histogram display of an exemplary embodiment of the measuring device according to the invention. In this context, the x-axis corresponds to the frequency, while the y-axis corresponds to the frequency of occurrence of the respective frequency value. In the middle of the pixel, the frequencies of occurrence are plotted with a conventional histogram display. In particular, high values disposed far apart are obtained in the region of the maximum. The values for a use of a measuring device according to the invention or respectively the method according to the invention are displayed in the right-hand lower corner of the pixel. Especially in the region of the maximum, the values are now distributed over a relatively larger number of pixels. They reproduce the ideal characteristic of the histogram significantly better.

Figure 8:
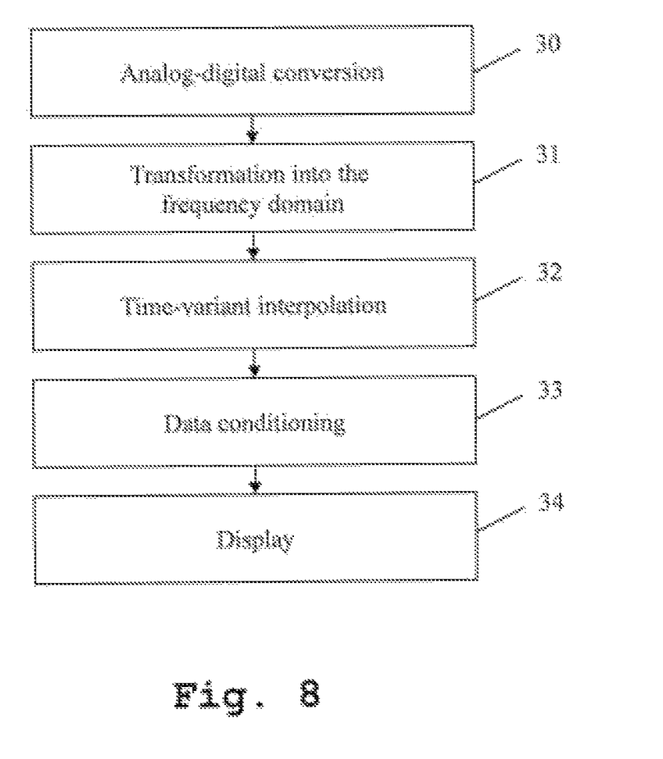
FIG. 8 illustrates a first exemplary embodiment of the method according to the invention in a flow diagram.

FIG. 8 shows a first exemplary embodiment of the method according to the invention for operating a measuring device. In a first step 30, an analog-digital conversion of a signal to be processed is implemented. Further pre-processing steps, such as a mixing of the signal in order to lower the frequency, are provided optionally before this first step 30. In a second step 31, a transformation into the frequency domain takes place. Since this is a discrete transformation, frequency grid-points are formed in this step. In a third step 33, a time variant interpolation of the frequency grid-points is implemented. That is, for every processed spectrum, the frequency grid-points are displaced by a given value. In this context, the displacement takes place up to a maximum of half the distance from the adjacent original frequency grid-point. The displacement preferably takes place in a randomised manner. That is, the distance by which each individual frequency grid-point is displaced should be as random as possible.

In a fourth step 33, a data conditioning is then implemented. That is, the values at the frequency grid-points are added up over several spectra and accumulated to form a histogram. Finally, in a fifth step 34, the values are displayed as a histogram.

Figure 9:
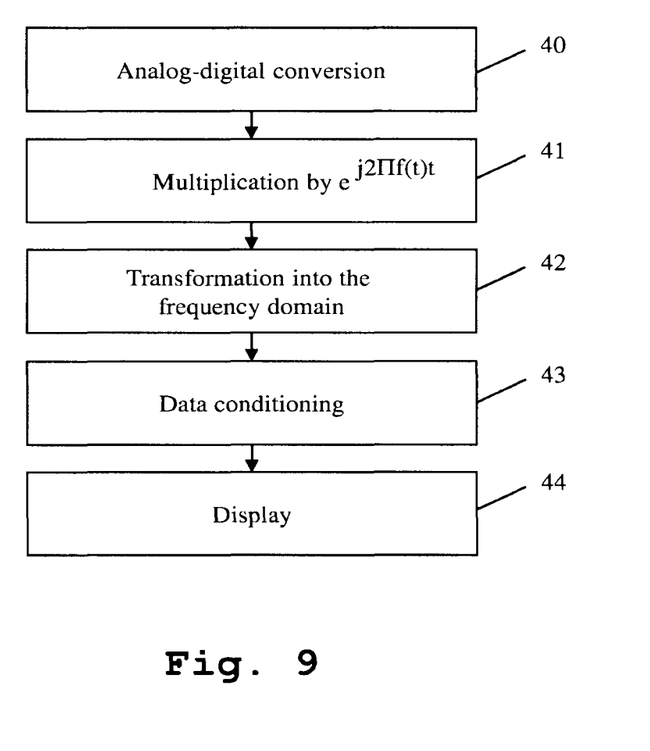
FIG. 9 illustrates a second exemplary embodiment of the method according to the invention in a flow diagram.

FIG. 9 shows a second exemplary embodiment of the method according to the invention for the operation of a measuring device. In this context, steps 40 to 44 correspond largely to steps 30 to 34 from FIG. 8. Only the second step 41 and the third step 42 differ from the steps illustrated in FIG. 8. Here, the digitised signal is multiplied in a second step 41 by a factor which is preferably a low-frequency, complex exponential oscillation. Following this, in the third step 43, the signal in the time domain is transformed into the frequency domain. Through the multiplication in the second step 41, a displacement of the frequency grid-points which are generated in the third step 42 is obtained. Otherwise, the method corresponds to the method illustrated with reference to FIG. 8.

The invention is not restricted to the exemplary embodiment presented. As already mentioned, extremely diverse measuring devices which implement a histogram display can be used. The displacement of the frequency grid-points can also be based upon extremely diverse algorithms. Accordingly, a cyclical displacement according to a linear algorithm is also possible alongside a random displacement. Advantageously within the scope of the invention, all of the features described above or illustrated in the drawings can be arbitrarily combined with one another.

The invention claimed is:

1. A measuring device to improve display imaging of spectral characteristics of digital signals, the measuring device comprising:
a signal-processing unit configured to register a first digital time domain signal;
a transformation unit configured to transform the first digital time domain signal into a first digital frequency domain signal,
a histogram-generating unit configured to indirectly generate a frequency domain histogram from the first digital frequency domain signal, the histogram-generating unit including a frequency grid-point variation unit,
wherein the first digital frequency domain signal comprises first frequency grid-points having a uniform frequency distance from each other,
wherein the frequency grid-point variation unit is embodied to generate a second digital frequency domain signal from the first digital frequency domain signal, by generating a displacement of first individual frequency positions of the first frequency grid-points of the first digital frequency domain signal, resulting in second frequency grid-points of the second digital frequency domain signal,
wherein the histogram-generating unit is embodied to determine the frequency domain histogram based on the second digital frequency domain signal,
wherein the frequency grid-point variation unit is embodied in such a manner that the displacement of the first individual frequency positions of the first frequency grid-points, resulting in second individual frequency positions of the second frequency grid-points, adopt an individually random value, resulting in the second frequency grid-points having a non-uniform frequency distance from each other, and
wherein the frequency grid-point variation unit is embodied in such a manner that the displacement of the first individual frequency positions of the first frequency grid-points, resulting in the second individual frequency positions of the second frequency grid-points, is implemented by a maximum of one half of an interval between the first frequency grid-points of the first digital frequency domain signal.

2. The measuring device according to claim 1, wherein the histogram-generating unit provides a transformation unit that is embodied to implement a transformation of one of the first digital time domain signal or a third digital time domain signal derived from the first digital time domain signal, from the time domain into the frequency domain.

3. The measuring device according to claim 2, wherein the frequency grid-point variation unit is a multiplier which is embodied to multiply the first digital time domain signal by a variable factor to form the third digital time domain signal, and
wherein the transformation unit is embodied to generate the second digital frequency domain signal from the third digital time domain signal.

4. The measuring device according to claim 1, wherein the histogram-generating unit provides a processing unit that is embodied to form the frequency domain histogram from the second digital frequency domain signal.

5. A method of operating a measuring device to improve display imaging of spectral characteristics of digital signals, the method comprising:
registering a first digital time domain signal;
transforming the first digital time domain signal into a first digital frequency domain signal,
indirectly generating a frequency domain histogram from the first digital frequency domain signal,
wherein the first digital frequency domain signal comprises first frequency grid-points having a uniform frequency distance from each other;
generating a second digital frequency domain signal from the first digital frequency domain signal, by generating a displacement of first individual frequency positions of the first frequency grid-points of the first digital frequency domain signal, resulting in second frequency grid-points of the second digital frequency domain signal,
wherein the frequency domain histogram is determined based on the second digital frequency domain signal,
wherein the displacement of the first individual frequency positions of the first frequency grid-points, resulting in second individual frequency positions of the second frequency grid-points, adopt an individually random value, resulting in the second frequency grid-points having a non-uniform frequency distance from each other, and
wherein the displacement of the first individual frequency positions of the first frequency grid-points, resulting in the second frequency positions of the second frequency grid-points, is implemented by a maximum of one half of an interval between the first frequency grid-points of the first digital frequency domain.

6. The method according to claim 5, further comprising implementing a transformation of one of the first digital time domain signal or a third digital time domain signal derived from the first digital time domain signal, from the time domain into the frequency domain.

7. The method according to claim 6, further comprising:
multiplying the first digital time domain signal by a variable factor to form the third digital time domain signal; and
generating the second digital frequency domain signal from the third digital time domain signal.

8. The method according to claim 5, wherein the frequency domain histogram is formed from the second digital frequency domain signal.

9. A system of improving display imaging of spectral characteristics of digital signals, the system comprising:
one or more processors; and
memory communicatively coupled to the one or more processors and storing executable instructions that, when executed by the one or more processors, cause the one or more processors to perform steps including:
registering a first digital time domain signal; and
transforming the first digital time domain signal into a first digital frequency domain signal,
indirectly generating a frequency domain histogram from the first digital frequency domain signal,
wherein the first digital frequency domain signal comprises the first frequency grid-points having a uniform frequency distance from each other,
generating a second digital frequency domain signal from the first digital frequency domain signal, by generating a displacement of first individual frequency positions of the first frequency grid-points of the first digital frequency domain signal, resulting in second frequency grid-points of the second digital frequency domain signal,
wherein the frequency domain histogram is determined based on the second digital frequency domain signal, wherein the displacement of the first individual frequency positions of the first frequency grid-points, resulting in second individual frequency positions of the second frequency grid-points, adopt an individually random value, resulting in the second frequency grid-points having a non-uniform frequency distance from each other, and wherein the displacement of the first individual frequency positions of the first frequency grid-points, resulting in the second frequency positions of the second frequency grid-points, is implemented by a maximum of one half of an interval between the first frequency grid-points of the first digital frequency domain.

10. The system according to claim 9, further comprising implementing a transformation of one of the first digital time domain signal or a third digital time domain signal derived from the first digital time domain signal, from the time domain into the frequency domain.

11. The system according to claim 10, further comprising:
multiplying the first digital time domain signal by a variable factor to form the third digital time domain signal; and
generating the second digital frequency signal from the third digital time domain signal.

12. The system according to claim 9, wherein the frequency domain histogram is formed from the second digital frequency domain signal.

* * * * *